United States Patent
Takekawa

(10) Patent No.: US 7,355,481 B2
(45) Date of Patent: Apr. 8, 2008

(54) AMPLIFICATION CIRCUIT AND CONTROL METHOD OF AMPLIFICATION CIRCUIT

(75) Inventor: Koji Takekawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 127 days.

(21) Appl. No.: 11/201,417

(22) Filed: Aug. 11, 2005

(65) Prior Publication Data

US 2006/0220745 A1 Oct. 5, 2006

(30) Foreign Application Priority Data

Mar. 30, 2005 (JP) ............... 2005-098582

(51) Int. Cl.
*H03F 3/04* (2006.01)
(52) U.S. Cl. ..................... 330/306; 330/302
(58) Field of Classification Search ........... 330/306, 330/302
See application file for complete search history.

(56) References Cited

U.S. PATENT DOCUMENTS

| 3,671,931 | A | * | 6/1972 | Loofbourrow ............ 367/67 |
| 4,007,429 | A | | 2/1977 | Cadalora et al. |
| 4,438,406 | A | * | 3/1984 | McCormick et al. ....... 327/558 |
| 4,498,055 | A | * | 2/1985 | Dolby ................. 330/284 |
| 4,673,916 | A | | 6/1987 | Kitamura et al. |
| 4,794,458 | A | | 12/1988 | Nagatomi |
| 6,559,718 | B2 | * | 5/2003 | Kudo et al. ............. 330/252 |
| 6,583,662 | B1 | * | 6/2003 | Lim .................. 327/553 |
| 2004/0042561 | A1 | | 3/2004 | Ho et al. |
| 2004/0165303 | A1 | | 8/2004 | Wu et al. |

FOREIGN PATENT DOCUMENTS

| EP | 1 383 248 A2 | 1/2004 |
| EP | 1 387 495 A1 | 2/2004 |
| JP | 11-88071 | 3/1999 |
| JP | 11-088071 A | 3/1999 |

* cited by examiner

*Primary Examiner*—Patricia Nguyen
(74) *Attorney, Agent, or Firm*—Arent Fox LLP

(57) ABSTRACT

An amplification circuit connected with a lowpass filter, which reduces the time required for compensating the amplification characteristic and starting up at turning on the power supply, and a control method thereof are provided. An amplification circuit 10, which operates in any one of the operation mode of ordinary operation mode MDN and special operation mode MDT, includes an amplifying section 20, a lowpass filter 30 connected to the amplifying section 20, and a lowpass filter setting section 40 that sets a cut-off frequency fc. In the case of an ordinary operation mode MDN, the cut-off frequency is set to an ordinary cut-off frequency fcn in which error in the output signal does not exceed an output allowable error as an allowable error, and in the case other than that, set to the side higher than the ordinary cut-off frequency fcn.

16 Claims, 11 Drawing Sheets

DIAGRAM ILLUSTRATING PRINCIPLE OF PRESENT INVENTION

FIG.2 BLOCK DIAGRAM OF CIRCUIT OF EMBODIMENT OF THE INVENTION

FIG.3 BLOCK DIAGRAM OF CIRCUIT SHOWING CONCRETE EXAMPLE OF AMPLIFYING SECTION

CIRCUIT DIAGRAM SHOWING CONCRETE EXAMPLE OF RESISTANCE VALUE ADJUSTING SECTION

CIRCUIT DIAGRAM SHOWING CONCRETE EXAMPLE OF RESISTANCE VALUE ADJUSTING SECTION

CIRCUIT DIAGRAM SHOWING CONCRETE EXAMPLE OF MINUTE VOLTAGE GENERATING SECTION

FIG.7 CIRCUIT DIAGRAM SHOWING CONCRETE EXAMPLE OF WINDOW COMPARATOR

FIG.8
WAVEFORM DIAGRAM SHOWING OPERATION OF AMPLIFICATION CHARACTERISTIC COMPENSATION MODE
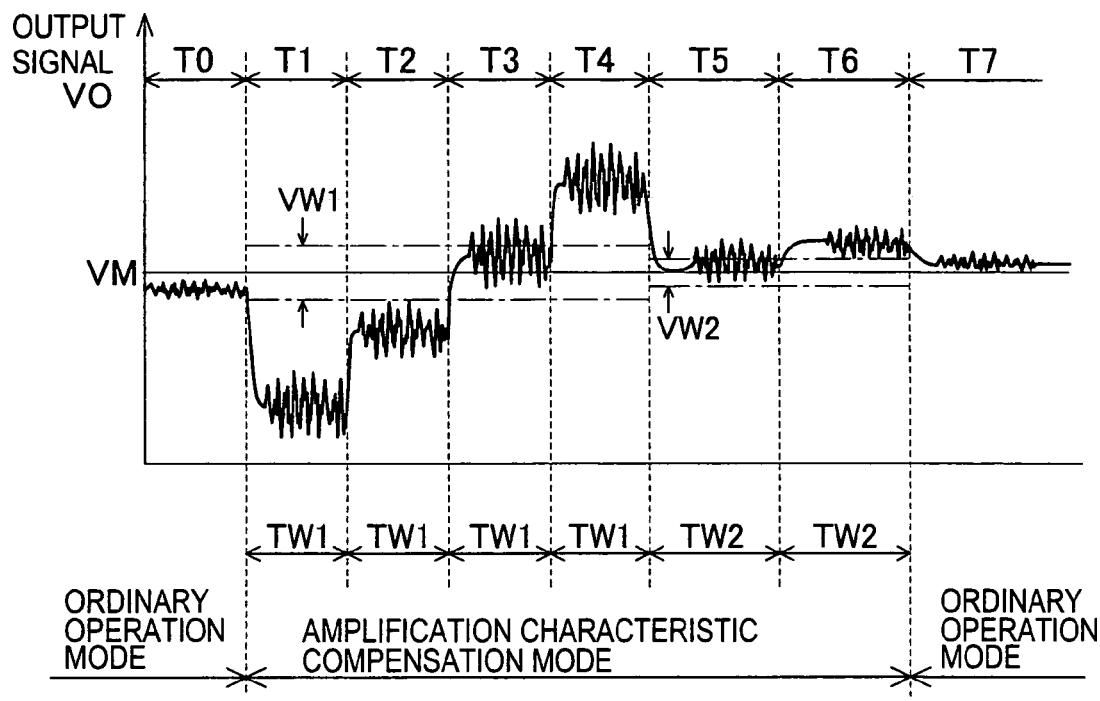
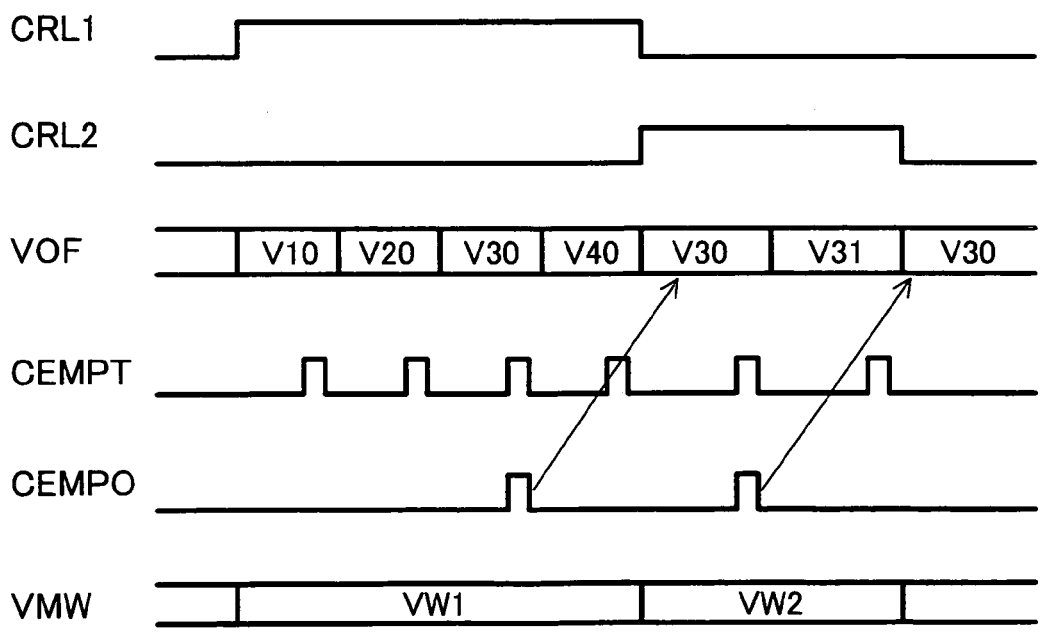

BLOCK DIAGRAM SHOWING MODIFICATION OF
COMPENSATION STORAGE SECTION

WAVEFORM DIAGRAM SHOWING OPERATION OF FAILURE DETECTION MODE

WAVEFORM DIAGRAM SHOWING OPERATION OF LOWPASS FILTER INITIALIZATION MODE

AMPLIFICATION CIRCUIT AND CONTROL METHOD OF AMPLIFICATION CIRCUIT

CROSS-REFERENCE TO RELATED APPLICATIONS

This application is based upon and claims the benefit of priority from the prior Japanese Patent Application No. 2005-098582 filed on Mar. 30, 2005, the entire contents of which are incorporated herein by reference.

BACKGROUND OF THE INVENTION

Field of the Invention

The present invention relates to an amplification circuit using a minute signal as an input for connecting a lowpass filter and a control method thereof.

As an example of an amplification circuit for amplifying minute signals, an amplification circuit, which connects to a sensor outputting detection signals in response to changes in physical value, is given. As for the sensor, a pressure sensor, an acceleration sensor, an angular velocity (gyro) sensor and the like are given.

In the signals inputted to the amplification circuit, noises such as 1/f noise are included along with the detection signals outputted from the sensor. Due to the influence of these noises, in the output of the amplification circuit, an error is generated with respect to the amplification output of the original detection signal. Therefore, in order to inhibit such noises, generally, a lowpass filter is connected to the amplification circuit. However, when the lowpass filter is connected, the response performance of the input/output decreases in the amplification circuit.

On the other hand, in the amplification circuit, in some cases, an amplification characteristic generated due to changes in temperature, power supply voltage or changes due to lapse of time are compensated.

An amplification circuit disclosed in Japanese unexamined patent publication No. H11 (1999)-88071 includes an offset voltage variable device for changing the offset voltage of the operational amplifier, a comparator means for comparing the output voltage of the operational amplifier with a predetermined reference voltage, and a control means that outputs an offset voltage control value and, based on the result of the comparator means, stores a control value in which output voltage of the operational amplifier and the reference voltage agree with each other. As disclosed in Japanese unexamined patent publication No. H11 (1999)-88071, the amplification circuit repeats amplification operation while changing the value of DAC as an offset voltage variable means; thus, the control value of the offset voltage is detected to carry out the compensation.

SUMMARY OF THE INVENTION

However, in the case where the above technique is applied to an amplification circuit connected with a lowpass filter as its object, amplification operation with poor response performance is repeated. As a result, the time required for the compensation increases resulting in a considerable problem.

Also, in the amplification circuit connected with a lowpass filter, there occurs another problem such that pre-charge time of the lowpass filter at turning on the power supply increases.

The present invention has been proposed to solve at least one of the above problems of the background art. An object of the present invention is to provide an amplification circuit connected with a lowpass filter, which reduces the time required for compensating the amplification characteristic and for starting up at turning on the power supply, and a control method thereof.

In order to achieve the above object, according to a first aspect, there is provided an amplification circuit, which operates in either one of operation modes of an ordinary operation mode for performing ordinary amplification operation and a special operation mode, comprising an amplifying section that amplifies an input signal and generates an output signal, a lowpass filter connected to the amplifying section for cutting off a frequency band at the side higher than a cut-off frequency to inhibit error in the output signal due to noises, and a lowpass filter setting section that sets the cut-off frequency, wherein the cut-off frequency is, in the case of the ordinary operation mode, set to an ordinary cut-off frequency in which error in the output signal does not exceed an output allowable error as an allowable error, and in the case of the special operation mode, set to the side higher than the ordinary cut-off frequency.

Also, according to the first aspect, there is provided a control method of an amplification circuit, which operates in either one of operation modes of an ordinary operation mode for performing ordinary amplification operation and a special operation mode, comprising the steps of amplifying an input signal and generating an output signal, cutting off a frequency band at the side higher than a cut-off frequency using a lowpass filter, thereby to inhibit error in the output signal due to noises, and setting the cut-off frequency, wherein the cut-off frequency is, in the case of the ordinary operation mode, set to an ordinary cut-off frequency in which error in the output signal does not exceed an output allowable error as an allowable error, and in the case of the special operation mode, set to the side higher than the ordinary cut-off frequency.

In the amplification circuit according to the present invention, the lowpass filter is connected to the amplifying section to cut off the frequency band at the side higher than the cut-off frequency; thereby an error in output signals due to noises is inhibited. In addition, the lowpass filter has such characteristics; i.e., the lower the cut-off frequency is, the larger the effect to inhibit the error in the output signals due to noises is obtained, while the worse the response performance at inputting/outputting is. In the present invention, focusing attention on the above fact, when operating in a special operation mode having a large output allowable error, the cut-off frequency is set to the side higher than the ordinary cut-off frequency. Accordingly, in this case, since the response performance of the lowpass filter is increased, the process in the special operation mode can be carried out swiftly.

The lowpass filter may be a passive filter well known in the art, which is configured of a resistance element and a capacitive element, or an active filter well known in the art, in which an operational amplifier is employed.

The special operation mode may include any modes which operate other than ordinary operation. For example, in particular, an amplification characteristic compensation mode in which the amplification characteristic of the amplifying section is detected and compensated, or lowpass filter initialization mode, in which the lowpass filter is pre-charged at turning on the power supply, are given.

In the amplification characteristic compensation mode, when detecting an amplification characteristic, the allowable error in the output may be smaller than the output allowable error in the ordinary operation mode. In such a case, by setting the cut-off frequency to the side higher than the ordinary cut-off frequency, the response performance of the lowpass filter can be increased to perform the process swiftly.

In the lowpass filter initialization mode, since only the capacitive element constituting the lowpass filter is precharged, the output signal is not referred to. Therefore, irrespective of the output allowable error, the cut-off frequency can be set to the side higher than the ordinary cut-off frequency.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 8 is a waveform diagram showing the operation of an amplification characteristic compensation mode;

DETAILED DESCRIPTION OF THE PREFERRED EMBODIMENTS

Embodiments of an amplification circuit and a control method of the amplification circuit in accordance with the present invention will be described in detail with reference to FIGS. 1 to 11.

Figure 1:
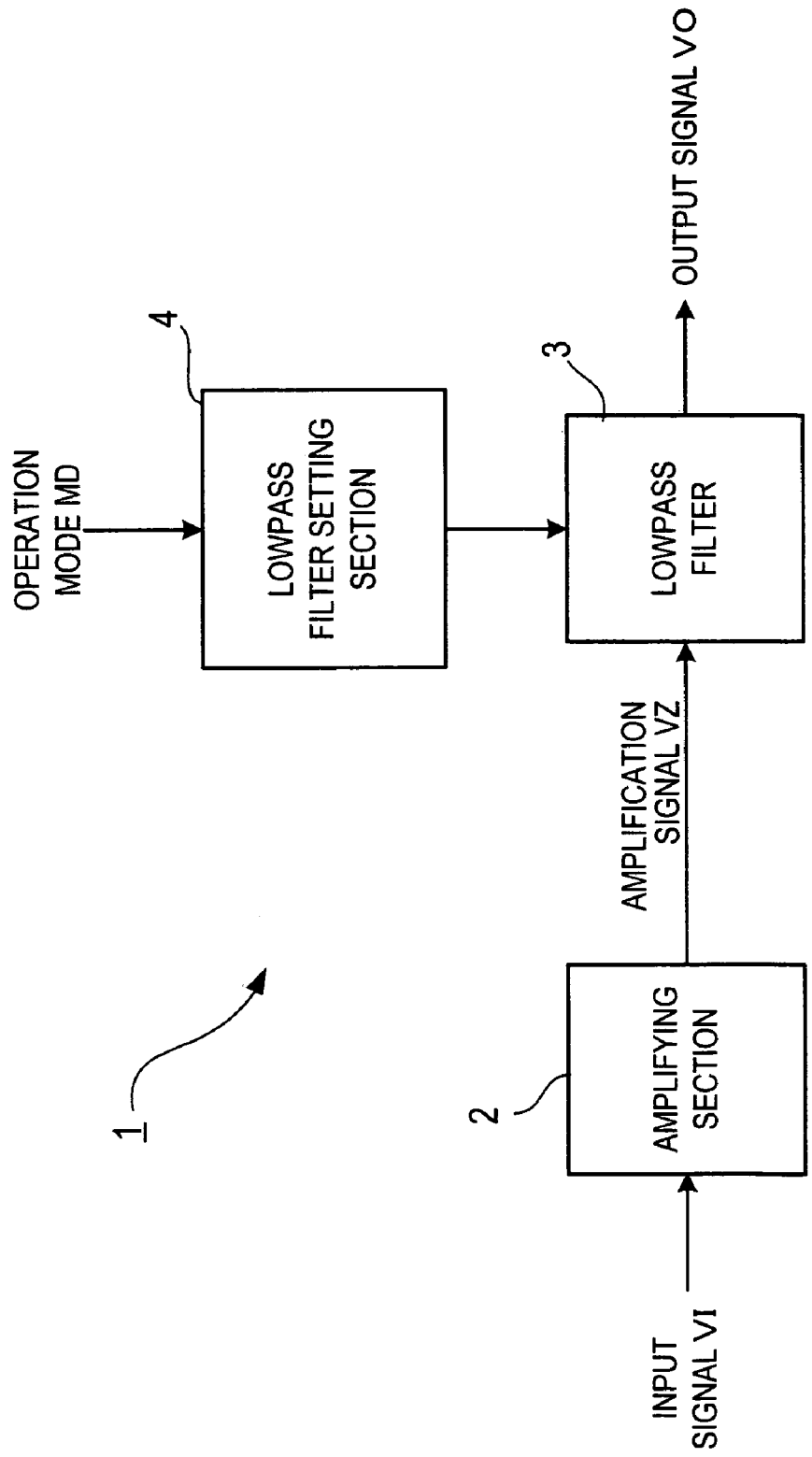
FIG. 1 is a diagram illustrating the principle of the present invention.

FIG. 1 is a diagram illustrating the principle of an amplification circuit 1 in accordance with the present invention. The amplification circuit 1 operates in any one of ordinary operation mode MDN for performing a predetermined amplification operation and special operation mode MDT.

The amplification circuit 1 includes an amplifying section 2 for amplifying input signals VI, a lowpass filter 3 connected to the amplifying section 2 for cutting off a frequency band at the side higher than a cut-off frequency fc, and a lowpass filter setting section 4 for switching the cut-off frequency fc of the lowpass filter 3 in accordance with the operation mode MD.

When an input signal VI is inputted to the amplifying section 2, an amplified amplification signal VZ is outputted to the lowpass filter 3. Further, with respect to the amplification signal VZ, the lowpass filter 3 cuts off the frequency band at the side higher than the cut-off frequency fc to remove noises, which are included in the amplification signal VZ causing an error in output signals VO.

It is understood that a large part of noises, which causes an error in the output signal VO, is the 1/f noise. The 1/f noise has such a characteristic that the lower frequency side generates the larger output level. That is, in the lowpass filter 3, when the cut-off frequency fc is set to the lower level, the larger effect to remove the 1/f noise is obtained. Contrary to this, the input/output response performance decreases.

The cut-off frequency fc is set in accordance with the operation mode MD in the lowpass filter setting section 4. In the case of the ordinary operation mode MDN for performing ordinary amplification operation, the cut-off frequency fc is set to an ordinary cut-off frequency fcn not exceeding an output allowable error EA in which an error EO in the output signal VO is allowable.

On the other hand, in the case of the special operation mode MDT, the cut-off frequency fc is set to the side higher than that of the ordinary operation mode MDN. In the lowpass filter 3, the higher cut-off frequency fc requires the shorter response time for inputting/outputting. Accordingly, in this case, the input/output response time of the lowpass filter 3 can be reduced shorter than that in the case of the ordinary operation mode MDN; and accordingly, the input/output response time in the amplification circuit 1 can be reduced.

First Embodiment

Figure 2:
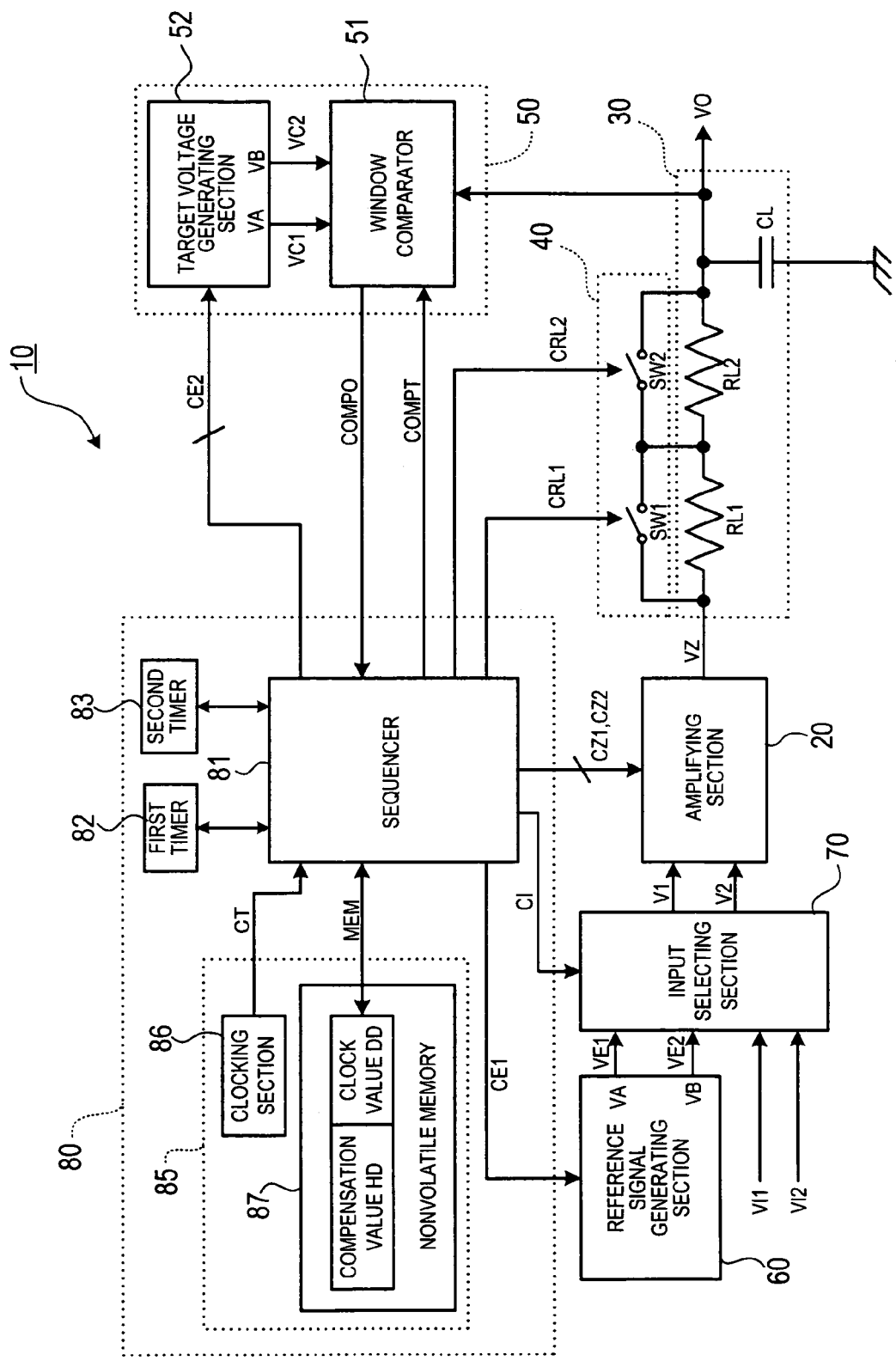
FIG. 2 is a block diagram of a circuit of an embodiment of the invention.

Next, FIG. 2 shows an amplification circuit 10 based on the principle diagram in FIG. 1.

The amplification circuit 10 is equipped with an amplifying section 20 that performs differential amplification of a pair of differential input signals V1 and V2, a lowpass filter 30 connected to the amplifying section 20, which cuts off a frequency band of the side higher than the cut-off frequency fc, and a lowpass filter setting section 40 that sets the cut-off frequency fc of the lowpass filter 30.

The lowpass filter 30 includes two resistance elements RL1 and RL2 connected to each other in parallel and a capacitive element CL. The amplification signal VZ inputted to one end of the resistance element RL1 is outputted to the output signal VO via the resistance elements RL1 and RL2. Also, one end of the capacitive element CL is connected to the output signal VO side of the resistance element RL2, and the other end thereof is connected to the ground. Accordingly, the lowpass filter 30 performs charge and discharge of the capacitive element CL via the resistance elements RL1 and RL2; thus, the lowpass filter 30 functions as a lowpass filter. The cut-off frequency fc of the lowpass filter 30 depends on a time constant, which is determined by the resistance elements RL1 and RL2 and the capacitive element CL.

The lowpass filter setting section 40 comprises two switches SW1 and SW2 connected to the both ends of each of the resistance elements RL1 and RL2 of the lowpass filter 30. ON/OFF operation of the switches SW1 and SW2 is controlled, respectively, by the control signal CRL1 and CRL2 from a controlling section 80. For example, when the control signal CRL1 is set to the high level, the switch SW1 turns ON; contrarily, when the control signal CRL1 is set to the low level, the switch SW1 turns OFF. Likewise, this control is carried out on the control signal CRL2 and the switch SW2. By setting these control signals CRL1 and CRL2, the cut-off frequency fc of the lowpass filter 30 can be changed. For example, when the control signal CRL1 is set to the high level (switch SW1=ON) and the control signal CRL2 is set to the low level (switch SW2=OFF), the resistance value of the time constant in the lowpass filter 30 is the resistance value of the resistance element RL2 only. Therefore, since the resistance value is small, in accordance with this, the cut-off frequency fc of the lowpass filter 30 changes to the higher band side.

When the control signal CRL1 is low level and the CRL2 is low level, the cut-off frequency fc of the lowpass filter 30 is set to the ordinary cut-off frequency fcn. When the control signal CRL1 is high level and CRL2 is low level, the cut-off frequency fc of the lowpass filter 30 is set to a first cut-off frequency fc1. And when the control signal CRL1 is low level and CRL2 is high level, the cut-off frequency fc of the lowpass filter 30 is set to a second cut-off frequency fc2. When both of the control signal CRL1 and the control signal CRL2 are set to high level, a state in which the resistance elements are short-circuited is obtained and the response time is the shortest.

Figure 3:
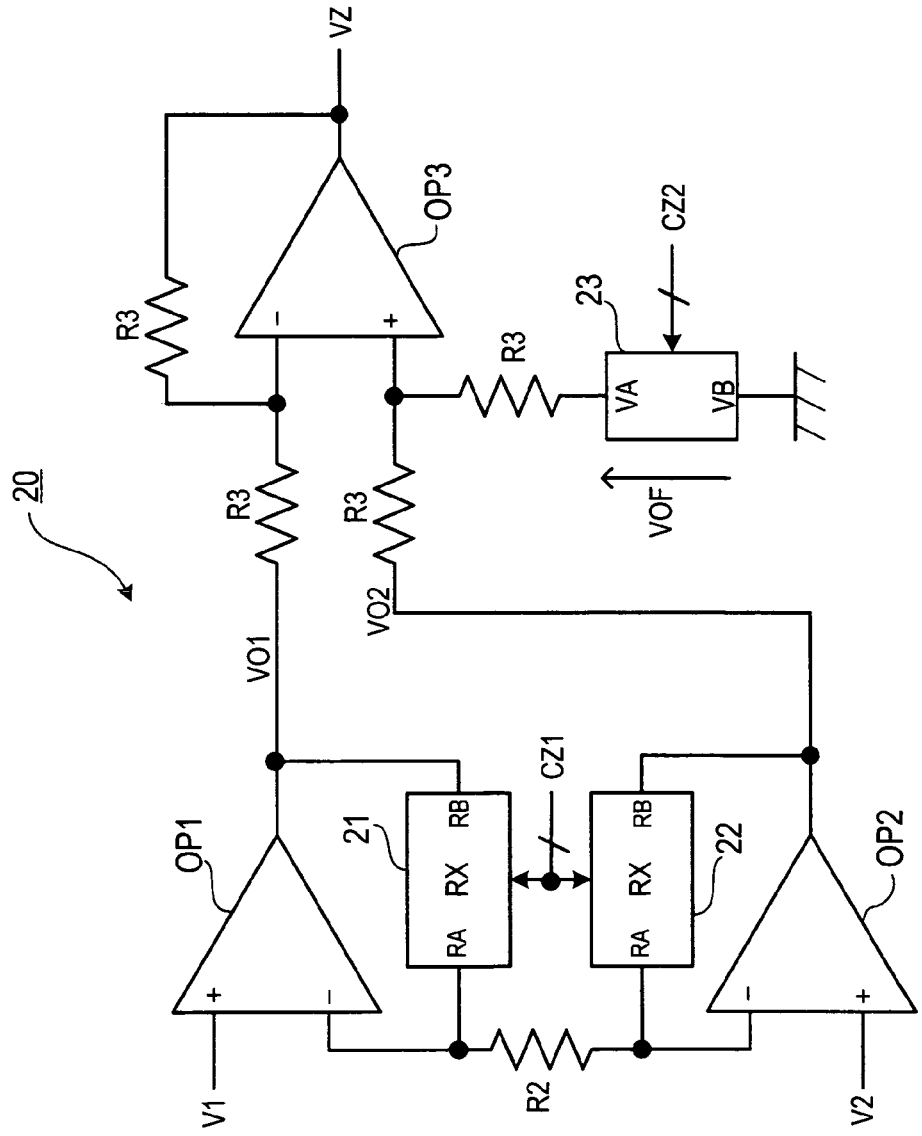
FIG. 3 is a block diagram of a circuit showing a concrete example of an amplifying section.
Figure 4:
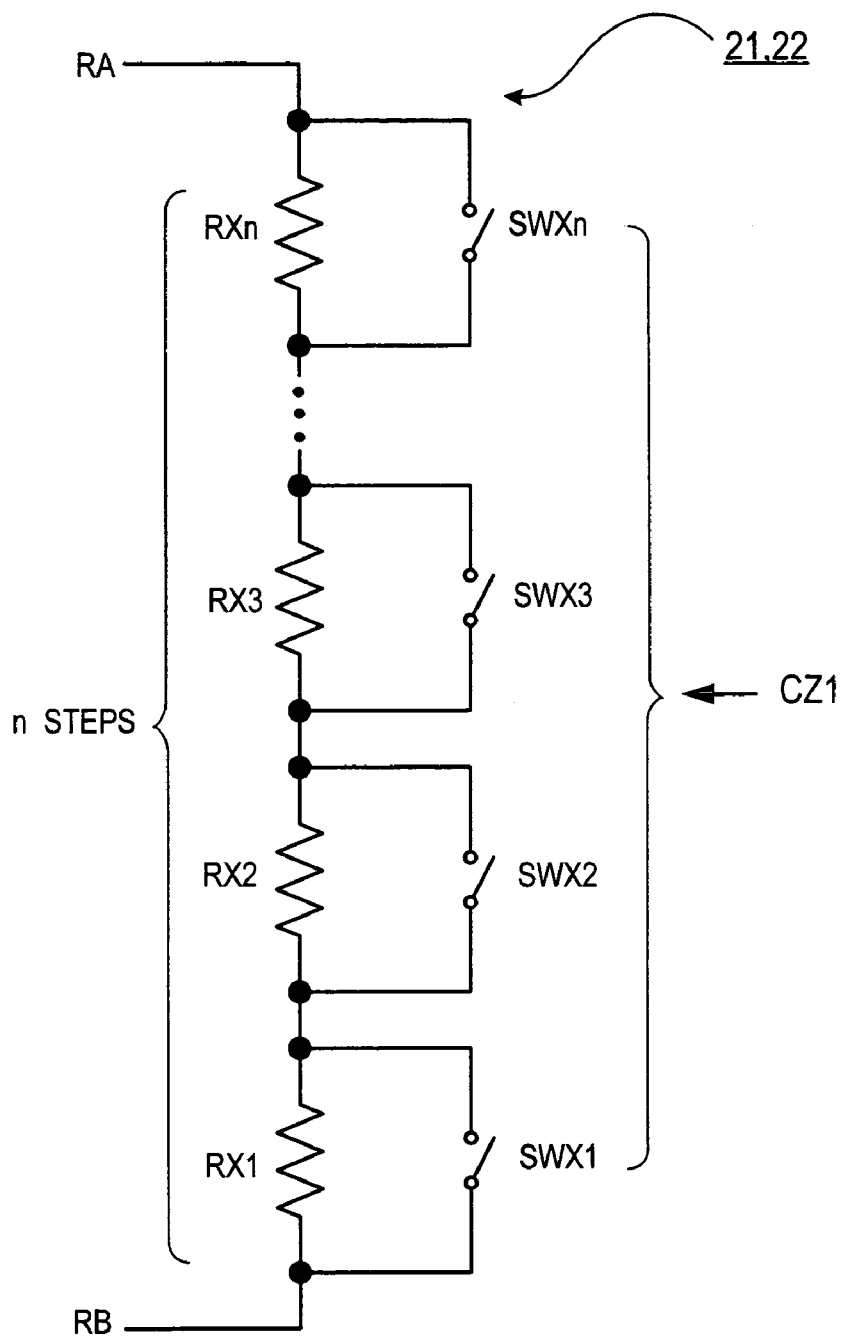
FIG. 4 is a circuit diagram showing a concrete example of a resistance value adjusting section.

Next, FIG. 3 shows a concrete example of the amplifying section 20.

The example is a differential amplification circuit of which a sensor comprises a Wheatstone bridge, which amplifies the differential voltage of the bridge as the sensor output. The amplifying section 20 includes three operational amplifiers OP1 to OP3, which are well known in the art, resistance adjusting sections 21 and 22 that carry out the gain compensation of the operational amplifiers OP1 and OP2, a minute voltage generation section 23 that carries out offset compensation of the operational amplifier OP3, and resistance elements R2 and R3.

In the above, the minute voltage generation section 23 is configured using the same circuit as that of a reference signal generating section 60 (refer to FIG. 6), which will be described later.

The operational amplifiers OP1 and OP2 constitute a negative feedback differential amplification circuit along with negative feedback resistances including the resistance adjusting sections 21 and 22, each of which changes at the same resistance value, and the resistance element R2. When the differential input signals V1 and V2 are inputted, a voltage expressed with the following formula is outputted to the amplification signal VZ.

Gain $G=(RX/R2*2)+1$, output signal $VO=VOF+(V1-V2)*G$

Accordingly, by adjusting the resistance value RX in the resistance adjusting sections 21 and 22, the gain G can be set; and by compensating the offset voltage VOF in the minute voltage generation section 23, the offset of the amplification signal VZ can be set appropriately.

The resistance adjusting sections 21 and 22 are circuits of which the resistance value can be variably set using a gain compensation value CZ1. In particular, the resistance adjusting sections 21 and 22 are configured using a circuit shown in FIG. 4.

The circuit is equipped with n-steps of resistance elements RX1 to RXn, which are connected to each other in series, and switches SWX1 to SWXn. Each of the switches SWX1 to SWXn short-circuits the both ends of each of the resistance elements RX1 to RXn. ON/OFF operation of the switches SWX1 to SWXn is controlled by the gain compensation value CZ1. When a switch is controlled to turn ON, the resistance value between the both ends of the corresponding resistance element results in 0. The (resultant) resistance value RX between the terminals RA and RB is the integrated value of the resistance values between the both ends of the respective resistance elements RX1 to RXn. Accordingly, the resistance value RX between the terminals RA and RB changes in accordance with the combination of the ON/OFF control of the gain compensation value CZ1. That is, the resistance value RX between the terminals RA and RB can be variably set using the gain compensation value CZ1.

Figure 5:
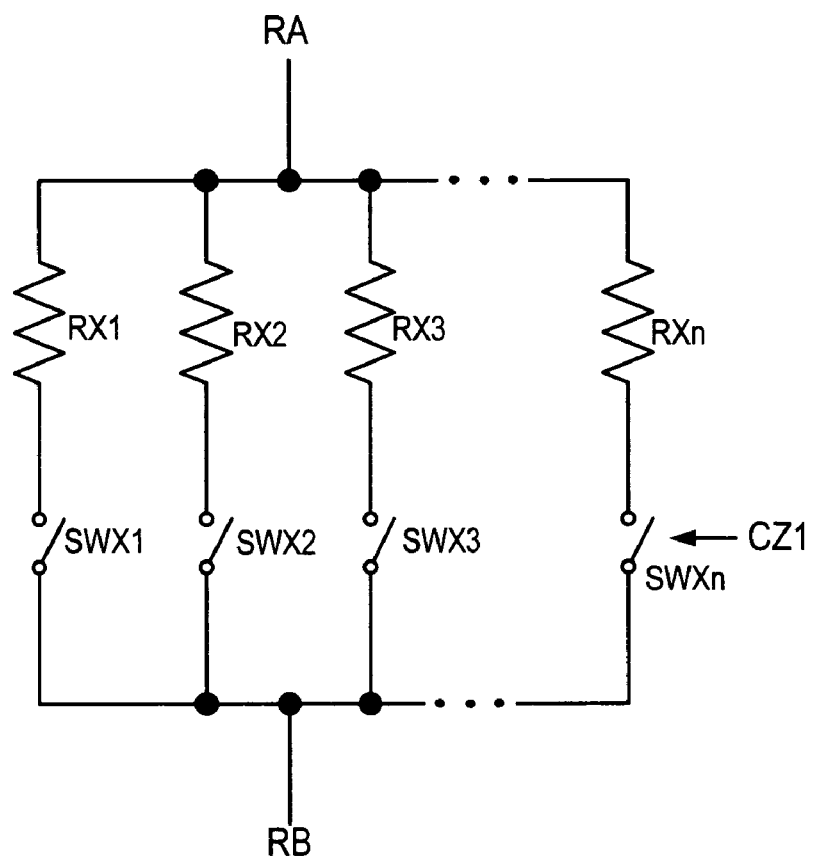
FIG. 5 is a circuit diagram showing a concrete example of the resistance value adjusting section.

Or, a circuit shown in FIG. 5 may be employed for the resistance adjusting sections 21 and 22. The circuit is configured as described below. That is, plural sets of resistance elements RX1 to RXn and switches SWX1 to SWXn are connected to each other in parallel; and each of the sets is configured of a pair of a resistance element and a switch being connected to each other in series. Also, ON/OFF operation of the switches SWX1 to SWXn is controlled with the gain compensation value CZ1. When a switch is controlled to turn OFF, an infinite large resistance value is obtained between the both ends of a set of the corresponding resistance element and switch. The (resultant) resistance value RX between the terminals RA and RB results in a parallel resistance value obtained by plural sets of the resistance element and switch, which are connected to each other in parallel. Accordingly, the resistance value RX can be changed in accordance with the combination of the ON/OFF control of the gain compensation value CZ1. That is, same as the circuit shown in FIG. 4, the resistance value RX between the terminals RA and RB can be variably set using the gain compensation value CZ1.

Referring to FIG. 2 again, the amplification circuit 10 is equipped with a window comparator 51, which decides whether the output signal VO is within a target voltage allowable error range VMW, which is set with the upper limit voltage value VC1 and the lower limit voltage value VC2, and a target voltage generating section 52, which generates the upper limit voltage value VC1 and the lower limit voltage value VC2.

Figure 7:
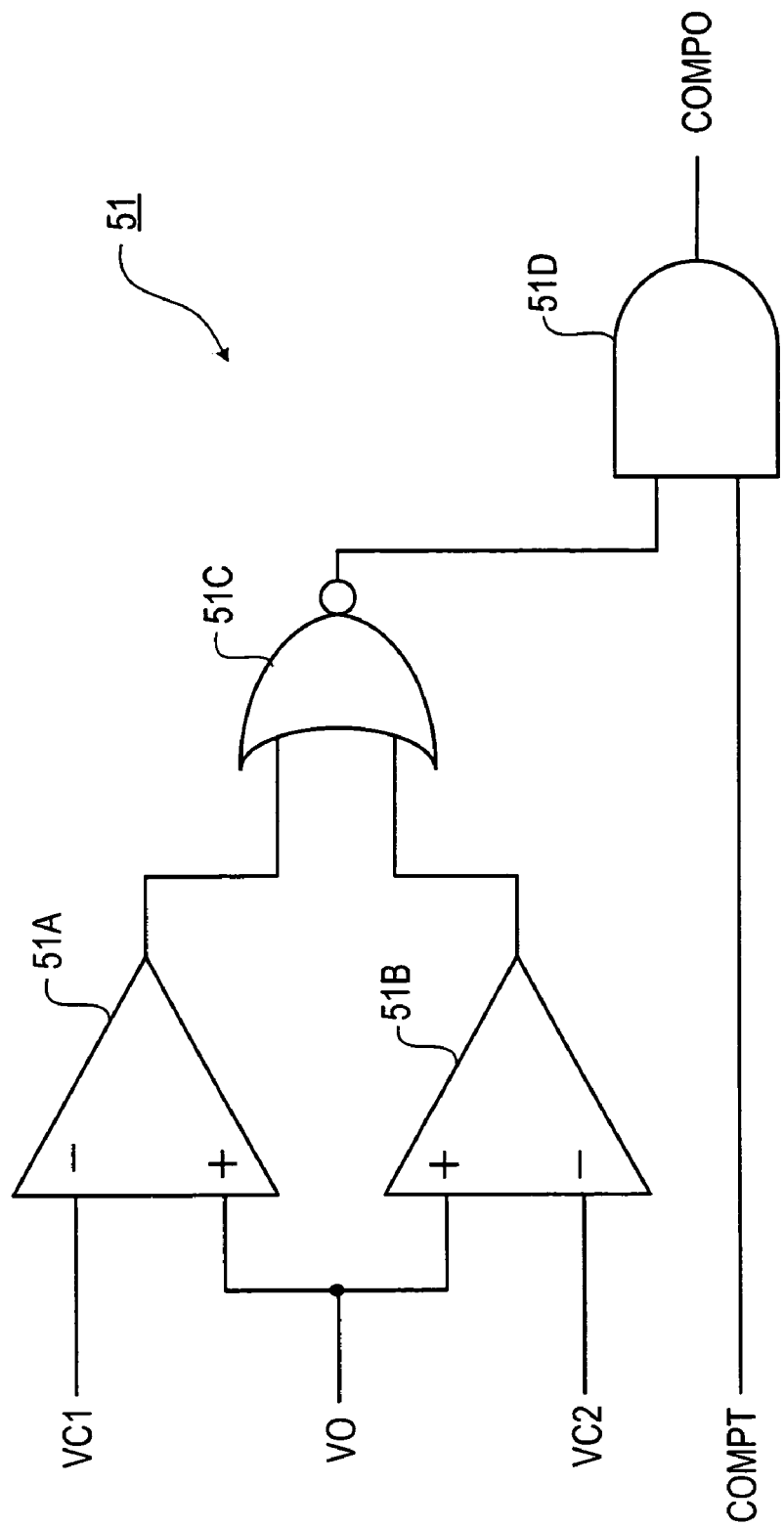
FIG. 7 is a circuit diagram showing a concrete example of a window comparator.

FIG. 7 shows a particular circuit of the window comparator 51. The window comparator 51 is equipped with two operational amplifiers 51A and 51B, a NOR gate 51C and an AND gate 51D. The operational amplifier 51A compares the output signal VO and the upper limit voltage value VC1, and when the output signal VO< the upper limit voltage value VC1, outputs the low level. Also, the operational amplifier 51B compares the output signal VO and the lower limit voltage value VC2, and when the output signal VO> the lower limit voltage value VC2, outputs the low level. Also, the NOR gate 51C which inputs the outputs of the operational amplifiers 51A and 51B, and when the both inputs are the low level, outputs the high level. The AND gate 51D which inputs the outputs of the NOR gate 51C and the comparison instruction signal COMPT, when the both inputs are the high level, outputs the high level. Accordingly, when the upper limit voltage value VC1> the output signal VO> the lower limit voltage value VC2, and when the comparison instruction signal COMPT is the high level, a comparison result comparison signal COMPO results in the high level.

Figure 6:
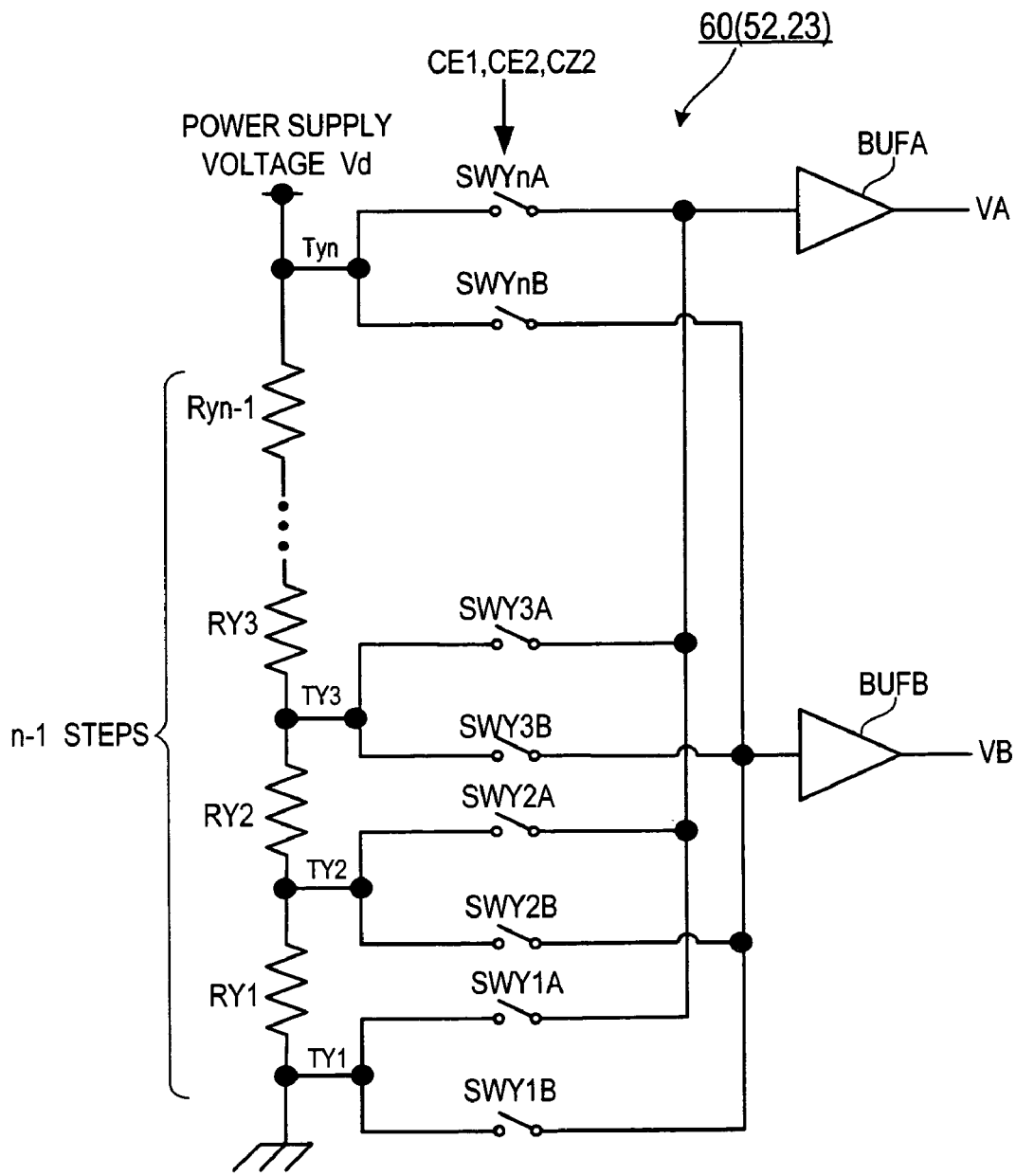
FIG. 6 is a circuit diagram showing a concrete example of a minute voltage generating section.

Next, FIG. 6 shows a particular circuit of the target voltage generating section 52. Between the power supply voltage Vd and the ground GND, resistance elements RY1 to RYn−1 having n−1 steps are connected to each other in series, and from each of the connection nodes, intermediate taps TY1 to TYn are extended. Further, to each of the intermediate taps, one end of a pair of switches is connected, and to the other end of the respective switches, buffers BUFA and BUFB are connected. For example, to an intermediate tap TY1, one end of the switches SWY1A and SWY1B is connected. Furthermore, to the other end of the switch SWY1A, the buffer BUFA is connected, and to the other end of the switch SWY1B, the buffer BUFB is connected.

Further, as for the switches SWY1A to SWYnA, among the switches SWY1A to SWYnA, only one switch is controlled to turn ON, and the rest thereof are controlled to turn OFF. Being controlled as described above, the potential of the intermediate tap, which is connected to the switch controlled to turn ON, is outputted as the reference potential VA via the buffer BUFA. For example, when the switch SWY3A is controlled to turn ON, the potential of the intermediate tap TY3 is outputted as the reference potential VA.

On the other hand, since the switches SWY1B to SWYnB are also controlled in the same manner, the potential thereof is outputted as the reference potential VB of the intermediate tap connected to the switch controlled to turn ON.

Referring to FIG. 2 again, the amplification circuit 10 is equipped with the reference signal generating section 60 that generates a pair of differential reference signals VE1 and VE2, and an input selecting section 70 comprises two input selectors well known in the art. The reference signal generating section 60 is configured of the same circuit as that of the target voltage generating section 52 (refer to FIG. 7). Also, the input selecting section 70 selects either one of the pair of differential input signals VI1 and VI2 and the pair of differential reference signals VE1 and VE2 depending on a select signal generated in accordance with the operation mode MD, and outputs the signals.

The amplification circuit 10 is further equipped with a controlling section 80. The controlling section 80 is equipped with a sequencer 81 well known in the art, which performs computing, comparison and sequence processing based on a program, a first timer 82, which performs timer operation at intervals of first standby time TW1, a second timer 83, which performs timer operation at intervals of second standby time TW2, and a compensation value storage 85 including a clocking section 86 and a nonvolatile memory 87.

In accordance with the processing, the sequencer 81 outputs the gain compensation value CZ1, an offset compensation signal CZ2, control signals CRL1 and CRL2, a reference signal control signal CE1, a select signal CI, a target voltage control signal CE2 and the comparison instruction signal COMPT.

Next, the operation of the amplification circuit 10 in accordance with the first embodiment will be described.

The amplification circuit 10 operates in the following modes; i.e., ordinary operation mode MDN in which a predetermined amplification operation is carried out; amplification characteristic compensation mode MDH in which the amplification characteristic of the amplifying section 20 is compensated; failure detection mode MDF in which failures of the amplification circuit 10 are simply detected; and lowpass filter initialization mode MDL in which, at turning on the power supply, the capacitive element CL in the lowpass filter 30 is pre-charged. The state of the respective sections in each operation mode will be described below.

When the amplification circuit 10 operates in the ordinary operation mode MDN, the differential input signals VI1 and VI2 are selectively inputted to the differential input signals V1 and V2. In the lowpass filter setting section 40, both of the switches SW1 and SW2 are controlled to turn OFF. Accordingly, in the lowpass filter 30, an ordinary cut-off frequency fcn depending on the time constant RL1+RL2 and CL is set. As described above, the error EO in the output signal VO of lowpass filter 30, in which the ordinary cut-off frequency fcn is set, is inhibited within an output allowable error EA.

On the other hand, when the amplification circuit 10 operates in the amplification characteristic compensation mode MDH, differential reference signals VE1 and VE2 are inputted to the differential input signals V1 and V2. Also, in the lowpass filter setting section 40, the controlling section 80 controls so that either one of the switches SW1 or SW2 turns OFF. Accordingly, in the lowpass filter 30, the cut-off frequency fc1 or fc2, which depends on the time constants RL1 and CL or RL2 and CL, is set. Since the resistance value is smaller than that in the case of the ordinary operation mode MDN, these cut-off frequencies fc2 and fc3 are at the side higher than the ordinary cut-off frequency fcn. Also, the response time of input/output in the lowpass filter 30 is reduced. In addition, a target voltage VM with respect to the differential reference signals VE1 and VE2 is derived based on the relationship with the amplification characteristic, and the target voltage control signal CE2 corresponding to the target voltage is outputted from the sequencer 81. The target voltage generating section 52 outputs the upper limit voltage value VC1 and the lower limit voltage value VC2 corresponding to the target voltage control signal CE2 to the window comparator 51.

In this embodiment, the differential reference signals VE1 and VE2 serve as the reference signals; and the sequencer 81, the window comparator 51 and the target voltage generating section 52 serve as the controlling section.

Next, a description will be given as to a concrete example in which, in the amplification characteristic compensation mode MDH, the offset voltage VOF is compensated in the amplifying section 20.

In the case where a characteristic fluctuation is generated in the amplifying section 20 caused by the changes in temperature and/or power supply voltage or caused by changes due to lapse of time, when the differential input signals V1 and V2 are inputted, a differential voltage VOFF is generated between the uniquely decided target voltage VM and the actually outputted voltage of the output signal VO. Therefore, by setting the differential voltage VOFF to the offset voltage VOF, the differential voltage VOFF can be eliminated.

As for the method to compensate the offset voltage VOF, the offset voltage VOF is gradually changed while comparing the target voltage VM with the output signal VO. And at the point when the target voltage VM and the output signal VO finally agree with each other, the offset voltage VOF is set. At first, the width to be changed for the offset voltage VOF is preferably set widely, and the width is reduced as the target voltage VM and the output signal VO come closer to each other. Thus, it is preferred that the agreement between the target voltage VM and the output signal VO can be detected quickly. In this example of the operation, the case, in which the offset voltage VOF is compensated using the method as described above, will be described.

FIG. 8 is a waveform diagram illustrating the operation to compensate the offset voltage VOF using the above-described method.

In FIG. 8, cycles T0 to T7 are shown as the steps of the operation. In cycle T0 and cycle T7, the amplification circuit 10 operates in the ordinary operation mode MDN; and in the cycles T1 to T6, operates in the amplification characteristic compensation mode MDH.

First of all, when shifting from cycle T0 to cycle T1, the control signal CRL1 is set to the high level; the control signal CRL2 is set to the low level; the target voltage allowable error range VMW indicated by the upper limit voltage value VC1 and the lower limit voltage value VC2 is set to the first voltage width VW1; and the standby time from the point when the offset voltage VOF is output to the point when the comparison instruction signal COMPT is outputted is set to the first standby time TW1, respectively.

In cycle T1, the offset voltage VOF is set to voltage V10. After the first standby time TW1 generated by the first timer 82 has passed, the comparison instruction signal COMPT is set to the high level, and at the same time, it is determined whether the output signal VO is within the range of the first voltage width VW1. Since the output signal VO is out of the range of the first voltage width VW1, the low level is outputted to the comparison signal COMPO.

In cycle T2, the offset voltage VOF is set to voltage V20. After the first standby time TW1 generated by the first timer 82 has passed, the comparison instruction signal COMPT is set to the high level, and at the same time, it is determined whether the output signal VO is within the range of the first voltage width VW1. Since the output signal VO is out of the range of the first voltage width VW1, the low level is outputted to the comparison signal COMPO.

In cycle T3, the offset voltage VOF is set to voltage V30. After the first standby time TW1 generated by the first timer 82 has passed, the comparison instruction signal COMPT is set to the high level, and at the same time, it is determined whether the output signal VO is with in the range of the first voltage width VW1. Since the output signal VO is within the range of the first voltage width VW1, the high level is outputted to the comparison signal COMPO.

In cycle T4, the offset voltage VOF is set to voltage V40. After the first standby time TW1 generated by the first timer 82 has passed, the comparison instruction signal COMPT is set to the high level, and at the same time, it is determined whether the output signal VO is within the range of the first voltage width VW1. Since the output signal VO is out of the range of the first voltage width VW1, the low level is outputted to the comparison signal COMPO.

Since the comparison signal COMPO is the high level in cycle T3, and in cycle T4, changes to the low level, it is determined that the offset voltage VOF closest to the target voltage VM is the voltage V30. In the next cycle (cycle T5), the control signal CRL2 is set to the low level; the target voltage allowable error range VMW is set to the second voltage width VW2; and the standby time from the point when the offset voltage VOF is outputted to the point when the comparison instruction signal COMPT is outputted is set to the second standby time TW2, respectively.

In cycle T5, the offset voltage VOF is set to voltage V30. After the second standby time TW2 generated by the second timer 83 has passed, the comparison instruction signal COMPT is set to the high level, and at the same time, it is determined whether the output signal VO is within the range of the second voltage width VW2. Since the output signal VO is within the range of the second voltage width VW2, the high level is outputted to the comparison signal COMPO.

In cycle T6, the offset voltage VOF is set to voltage V31. After the second standby time TW2 generated by the second timer 83 has passed, the comparison instruction signal COMPT is set to the high level, and at the same time, it is determined whether the output signal VO is within the range of the second voltage width VW2. Since the output signal VO is out of a range of the second voltage width VW2, the low level is outputted to the comparison signal COMPO.

Since the comparison signal COMPO is at the high level in cycle T5, and changes to the low level in cycle T6, it is determined that the offset voltage VOF closest to the target voltage VM is the voltage V30, and the amplification characteristic compensation mode MDH is terminated. And at the same time, the voltage V30 is set to the offset voltage VOF. That is, from cycle T7 onward, the operation mode MD shifts to the ordinary operation mode MDN.

As for the actual voltages of the voltages V10 to V40 and V31 shown in the example of operation, the voltage V10 is set to 0 mV; the voltage V20 is set to 20 mV; the voltage V30 is set to 40 mV; the voltage V31 is set to 50 mV; and the voltage V40 is set to 60 mV. As for the actual voltage of the first voltage width VW1 and the second voltage width VW2, which indicate the voltage width of the target voltage allowable error range VMW with respect to the target voltage VM, the first voltage width VW1 is set to 20 mV; and the second voltage width VW2 is set to 10 mV. That is, the variation width of the offset voltage VOF agrees with the target voltage allowable error range VMW. For example, the variation width (voltage V20-voltage V10) of the offset voltage VOF when shifting from cycle T1 to cycle T2 is 20 mV; and at this time, the target voltage allowable error range VMW is the first voltage width VW1; i.e., 20 mV. Therefore, it is possible to reliably judge whether the output signal VO agrees with the target voltage allowable error range VMW with respect to the target voltage VM.

In the example of operation, with respect to the case where each cut-off frequency fc is set, the noise amount included in the output signal VO and the response time of the lowpass filter 30 has been previously measured and comprehended. When the ordinary cut-off frequency fcn is set (CRL1=low level, CRL2=low level), the noise amount included in the output signal VO is 2 mVpp, and the response time is 100 ms; when the second cut-off frequency fc2 is set (CRL1=high level, CRL2=low level), the noise amount included in the output signal VO is 10 mVpp, and the response time is 20 ms; and when the cut-of frequency fc1 is set (CRL1, CRL2=high level), the noise amount included in the output signal VO is 20 mVpp, and the response time is 10 ms.

Next, the relationship between the target voltage allowable error range VMW and the cut-off frequency fc, which are set in each cycle, will be described.

In cycle T1 to T4, to the target voltage allowable error range VMW, the first voltage width VW1 (20 mV) is set, and to the cut-off frequency fc, the first cut-off frequency fc1 (noise amount=20 mVpp) is set. In cycle T5 to T6, to the target voltage allowable error range VMW, the second voltage width VW2 (10 mV) is set, and to the cut-off frequency fc, the second cut-off frequency fc2 (noise amount=10 mVpp) is set. That is, in any cycle, the cut-off frequency fc in which the noise amount equal to the target voltage allowable error range VMW or less is decided. Since being adapted as described above, the comparison judgment of the output signal VO and target voltage VM is carried out reliably.

Then, the processing time of the amplification characteristic compensation mode MDH will be described. The processing time is obtained based on the standby time TW (period of time from the point when the offset voltage VOF is inputted to the point when the comparison instruction signal COMPT is outputted), which is set in each cycle.

In cycle T1 to T4, each standby time TW is the first standby time TW1; i.e., 10 ms. Accordingly, the total standby time TW in cycles T1 to T4 is 40 ms. In cycle T5 to T6, each standby time TW is the second standby time TW2; i.e., 20 ms. Accordingly, the total standby time TW in cycle T5 to T6 is 40 ms; and the inclusive sum of the standby time TW in cycles T1 to T6 is 80 ms.

When the present invention is not applied, the standby time TW is always 100 ms, which is the standby time corresponding to the ordinary cut-off frequency fcn. Therefore, the inclusive sum of the standby time TW in cycles T1 to T6 is 600 ms.

In the amplification circuit 10 to which the present invention is applied, the processing time of the amplification characteristic compensation mode MDH is reduced to about ⅛ of that in the case to which the present invention is not applied.

In this embodiment, to describe simply, an example in which the number of operation steps is reduced is given. However, in the actual instruments, since a fine offset compensation is made in a wider dynamic range, the compensation is carried out in a larger number of operation steps. When the present invention is applied to an actual instrument, a further larger effect of time reduction will be obtained.

In the conventional amplification circuits, the calibration to compensate the amplification characteristic was indispensable before operation. Therefore, the amplification circuit could not be used immediately after turning on the power.

Contrarily, in the present invention, even when only a small period of time is allowed for idling the instrument, calibration can be carried out. For example, by arbitrarily carrying out the calibration during the operation of the instrument, the calibration before the operation can be omitted. And further, the amplification circuit can always be maintained in a state of a high accuracy being well compensated.

On the other hand, Japanese Published Unexamined Patent Application No. H11-88071 discloses the following technique. That is, compensation values of the amplification characteristic in each application conditions, which are previously obtained using a considerably large period of time, are stored in a storage such as nonvolatile memory, and a compensation value in accordance with the application conditions of the amplification circuit is taken out and the amplification circuit is adjusted in accordance with the compensation value. By employing the technique disclosed in the Japanese Published Unexamined Patent Application No. H11-88071, the calibration prior to the operation can be omitted.

Contrarily, when the present invention is employed, and by arbitrarily carrying out the calibration during the operation of the instrument in the same manner as described above, the calibration prior to the operation can be omitted without being equipped with a storage such as nonvolatile memory nor previously obtaining the compensation values of the amplification characteristic in each application condition.

In this embodiment, the following example has been described. That is, the differential reference signals VE1 and VE2, which are generated by the reference signal generating section 60, are inputted to the amplifying section 20 to operate. However, an unshown sensor may be set to the standard status, and sensor reference signals, which are generated at that time, may be used as the input. As for the sensor reference signal, for example, a 0-point output signal, which is outputted when the sensor is set to the 0-point, is available.

Next, a description will be given as to the features of the amplification characteristic compensation value ZD such as offset voltage VOF obtained by setting the amplification characteristic. And further, means with which the invention solves the problems will be described.

As described above, in the amplification circuit disclosed in the Japanese Published Unexamined Patent Application No. H11-88071, the following technique has been proposed. That is, the compensation value of the amplification characteristic is previously obtained and stored in the storage. And when the power is turned on again to start up, the amplification characteristic is set using the stored compensation value of the amplification characteristic, thereby the time required for compensating the amplification characteristic is reduced or omitted.

However, for converting a physical value such as pressure, acceleration and angular velocity into an electrical signal, in many cases, a sensor connected to an amplification circuit is provided with a moving part. Accordingly, a change tends to occur as time passes due to the influence of wear, metal fatigue and the like. Such change due to lapse of time appears as an error with respect to the amplification output of an original detection signal. Accordingly, there resides a problem in the amplification circuit disclosed in the Japanese Published Unexamined Patent Application No. H11-88071 such that error, in the case where changes due to lapse of time occur to the connected sensor, cannot be eliminated.

In order to solve the above problems it is preferred that the amplification circuit according to claim 2, which further includes an event counting section that counts the events occurring continuously in time series and outputs and holds the event count value, and a characteristic value storing section constituted of a nonvolatile storage that, in the measurement of the amplification characteristic, assuming that a value corresponding to the measurement result is an amplification characteristic value, and assuming that the event count value for obtaining the amplification characteristic value is the event count value during compensation, stores the amplification characteristic value and the event count value during compensation, wherein before measurement of the amplification characteristic, it is judged whether the difference value between the event count value during compensation stored in the characteristic value storing section and the event count value outputted from the event counting section exceed a predetermined value, when the difference value exceeds the predetermined value, the amplification characteristic value is obtained, and the obtained amplification characteristic value and the event count value at obtaining are stored in the characteristic value storing section, when the difference value does not exceed the predetermined value, the amplification circuit is compensated in accordance with the amplification characteristic value stored in the characteristic value storing section.

In the amplification circuit according to the present invention, before compensating the amplification characteristic, the event count value during compensation stored in the characteristic value storing section is compared with the present event count value. When the difference exceeds a predetermined value, the amplification characteristic value is obtained again, and a new amplification characteristic value is stored in the storage along with the event count value during compensation as the event count value at that time. On the other hand, when the difference does not exceed the predetermined value, the amplification characteristic value stored in the characteristic value storing section is used as the compensation value of the amplification circuit.

For example, it is preferred to set a predetermined value equivalent to a period that changes in a sensor due to lapse of time are expected. At a point of time when changes in the sensor due to lapse of time are expected to occur, since the amplification characteristic value is obtained again, the error caused by the changes in the sensor due to lapse of time can be eliminated.

As for the event, which occurs continuously in time series, for example, in particular, a clock generated with a certain frequency is given. The intervals between the events may not always be regular intervals. For example, a clock, which is generated only when the power supply of the amplification circuit is turned on, or a signal representing the turn on of the power supply for the amplification circuit.

As for the event counting section, a calendar clock using a clock generated with a certain frequency as the input, or power-on counter using a signal representing the power-on of the amplification circuit as the input are available.

The nonvolatile storage is a storage in which the contents therein are maintained even when the power supply of the amplification circuit is cut off. For example, a flash memory or volatile memory connected with a battery backup are given.

In the amplification circuit 10 according to the first embodiment, in order to eliminate the error caused by the changes in the sensor due to lapse of time, the amplification characteristic compensation value ZD such as offset voltage VOF obtained by setting the amplification characteristic can be stored in the compensation value storage 85. The compensation value storage 85 is equipped with the clocking section 86 having a backup function and clocking day and time, and the nonvolatile memory 87 for storing the amplification characteristic compensation value ZD along with a clock value KD generated by the clocking section 86. The clock value KD includes clock information (day and time) when the amplification characteristic compensation value ZD is stored. When carrying out the amplification characteristic compensation, the sequencer 81 reads out the clock value KD along with the amplification characteristic compensation value ZD. At the same time, the present clock information is read out from the clocking section 86 to obtain the difference between the previously read out clock value KD and the present clock information. As a result, when a predetermined day and time has not been passed, the amplification characteristic is compensated using the amplification characteristic compensation value ZD; and if not so, a new amplification characteristic compensation value is obtained.

Owing to this, when the predetermined day and time has been passed from the previous detection of the amplification characteristic, the amplification characteristic compensation value can be obtained. This enables the amplification characteristic generated from the changes due to lapse of time to be compensated.

In this embodiment, the clocking section 86 is equivalent to the event counting section, the clock value KD is equivalent to event count value, the nonvolatile memory 87 is equivalent to characteristic value storing section, and the amplification characteristic compensation value ZD is equivalent to the amplification characteristic value.

In order to eliminate the influence of the changes due to lapse of time as described above, not only the compensation of the amplification characteristic of the amplifying section, but the compensation of the amplification characteristic including the sensor is necessary. In the amplification circuit 10 according to the first embodiment, the reference signal generating section 60 gives the reference to the amplifying section 20. In the case of the compensation of the amplification characteristic including the sensor, in place of generating the reference signal, the amplification circuit 10 serves as the circuit that sets the sensor physically to the reference state. As for the circuit for setting the sensor physically to the reference state, an unshown positioning circuit of the sensor movable section using an electrostatic force, which is well known in the art, is available.

Figure 9A:
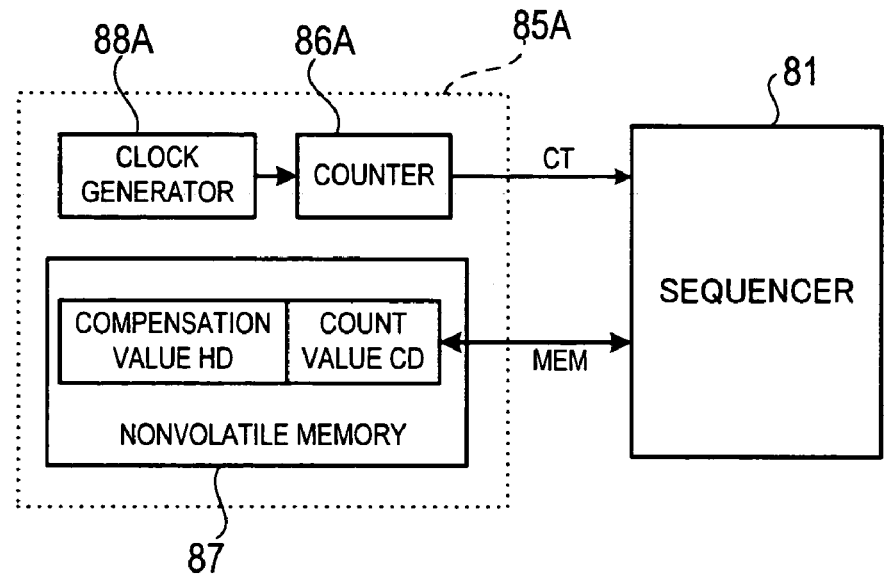
FIG. 9 is a block diagram showing a modification of a compensation storage section.

Also, in order to eliminate the error caused by the changes in the sensor due to lapse of time, in place of the compensation value storage 85 according to the first embodiment, a compensation value storage 85A shown in FIG. 9(A) may be used. The compensation value storage 85A is equipped with a clock generator 88A in place of the clocking section 86, and a counter 86A that counts the clock generated by the clock generator 88A and has a backup function. In the nonvolatile memory 87, along with the previously detected amplification characteristic compensation value ZD, count value CD outputted simultaneously by the counter 86A is stored. When carrying out the compensation of the amplification characteristic, the sequencer 81 reads out the count value CD along with the amplification characteristic compensation value ZD. At the same time, the present count value is read out from the counter 86A and is compared with the previously read out clock value KD. As a result, when the predetermined count number has not been exceeded, the amplification characteristic is compensated using the amplification characteristic compensation value ZD. If not so, a new amplification characteristic compensation value ZD is obtained.

Owing to this, when a predetermined count number has been exceeded from the previously obtained amplification characteristic compensation value ZD, by obtaining the amplification characteristic compensation value ZD, the error caused by the changes in the sensor due to the lapse of time can be eliminated.

In this embodiment, the clock generator 88A and counter 86A are equivalent to the event counting section, the count value CD is equivalent to the event count value, the nonvolatile memory 87 is equivalent to the characteristic value storing section, and the amplification characteristic compensation value ZD is equivalent to the amplification characteristic value.

Figure 9B:
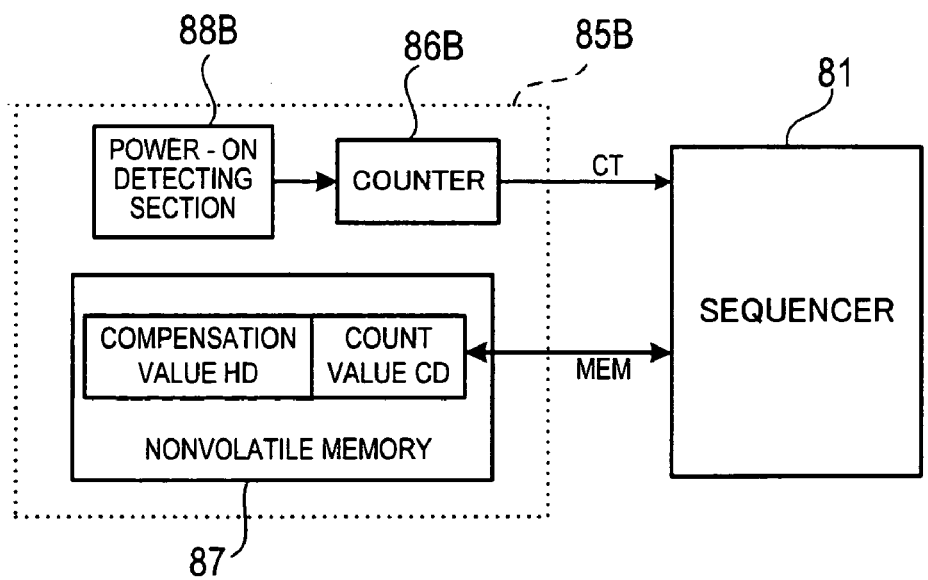

Likewise, in place of the compensation value storage 85 according to the first embodiment, a compensation value storage 85B shown in FIG. 9(B) may be used. The compensation value storage 85B is equipped with a power-on detecting section 88B in place of the clocking section 86, and a counter 86B that counts the pulse generated by the power-on detecting section 88B and has a backup function. In the nonvolatile memory 87, along with the previously detected amplification characteristic compensation value ZD, count value CD outputted simultaneously by the counter 86B is stored. When carrying out the compensation of the amplification characteristic, the sequencer 81 reads out the count value CD along with the amplification characteristic compensation value ZD. At the same time, the present count value is read out from the counter 86B and is compared with the previously read out clock value KD. As a result, when the predetermined count number has not been exceeded, the amplification characteristic is compensated using the amplification characteristic compensation value ZD. If not so, a new amplification characteristic compensation value is obtained.

In this embodiment, the power-on detecting section 88B and counter 86B are equivalent to the event counting section, the count value CD is equivalent to the event count value, the nonvolatile memory 87 is equivalent to the characteristic value storing section, and the amplification characteristic compensation value ZD is equivalent to the amplification characteristic value.

Owing to this, when a predetermined number of the turn-on of the power has been exceeded from the previously obtained amplification characteristic compensation value, by obtaining the amplification characteristic compensation value, the error caused by the changes in the sensor due to lapse of time can be eliminated.

Returning to the description of the operation mode MD, in the case where the amplification circuit 10 operates in the failure detection mode MDF, failure detection reference signals VF1 and VF2 for failure detection are inputted to the differential input signals V1 and V2. These failure detection reference signals VF1 and VF2 are voltages for detecting whether the amplification circuit 10 operates normally, by setting the controlling section 80, the signals are outputted from the reference signal generating section 60.

With respect to the differential reference signals VE1 and VE2, a failure detection target voltage VFM is derived based on the relationship with the amplification characteristic, and in accordance with this, the target voltage control signal CE2 is outputted from the sequencer 81. In the target voltage generating section 52, the upper limit voltage value VC1 and the lower limit voltage value VC2 corresponding to the target voltage control signal CE2 are outputted to the window comparator 51. After the failure detection reference signals VF1 and VF2 for failure detection are applied, both of the control signals CRL1 and CRL2 are set to the high level to increase the response speed of the lowpass filter 30; thus, the comparison judgment between the output signal VO and the failure detection target voltage VFM is carried out swiftly.

In this embodiment, the failure detection reference signals VF1 and VF2 are equivalent to the reference signals, the sequencer 81, the window comparator 51 and the target voltage generating section 52 are equivalent to the controlling section.

Figure 10:
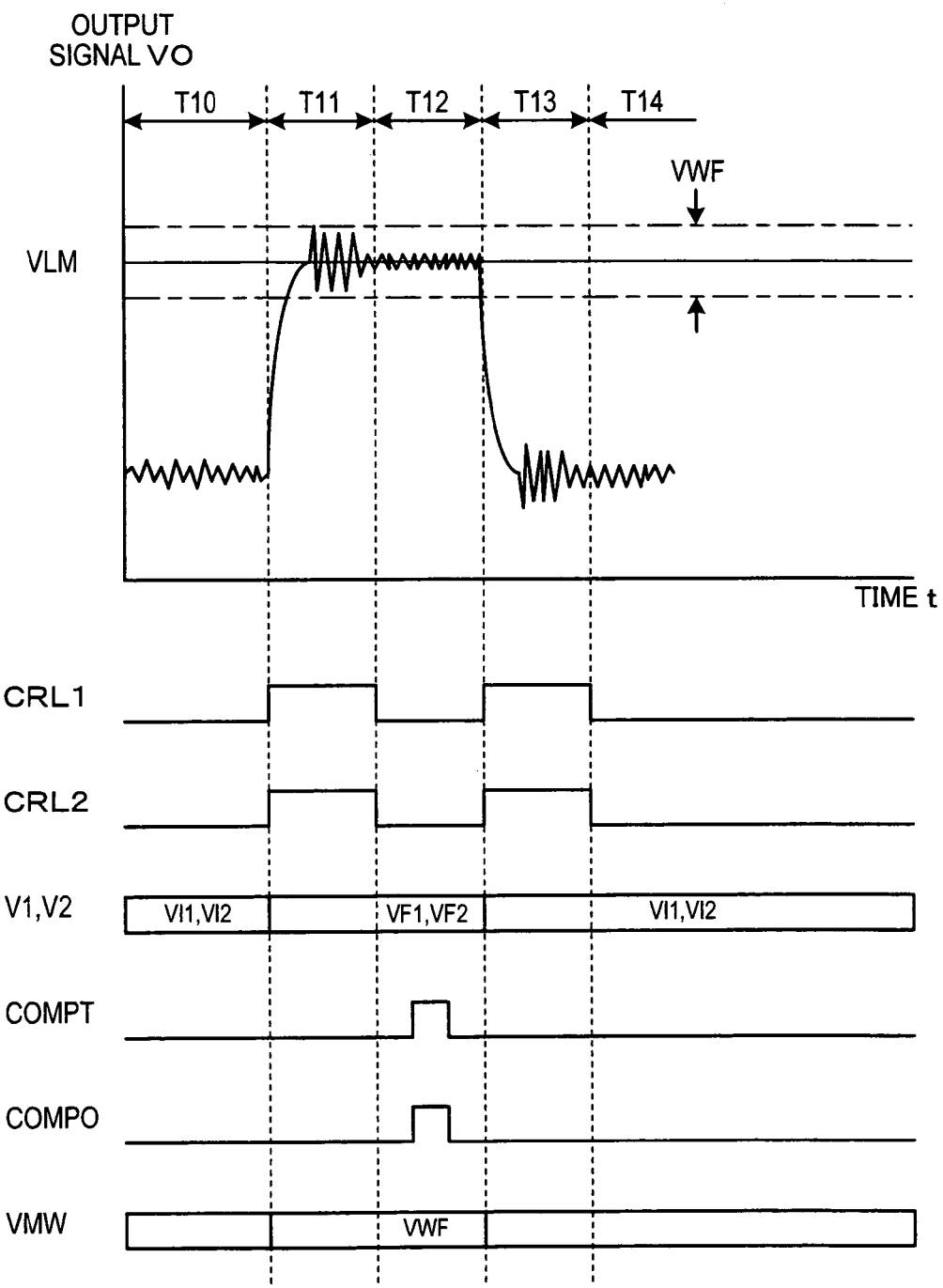
FIG. 10 is a waveform diagram showing the operation of a failure detection mode.

Referring to FIG. 10, the operation of the failure detection mode MDF will be described below.

FIG. 10 shows cycles T10 to T14 as the steps of the operation. In cycle T10 and cycle T14, the amplification circuit 10 operates in the ordinary operation mode MDN; and in cycle T11 to T13, operates in the failure detection mode MDF.

First of all, when shifting from cycle T10 to cycle T11, the failure detection reference signals VF1 and VF2 are inputted to the differential input signals V1 and V2, both of the control signals CRL1 and CRL2 are set to the high level, and the target voltage allowable error range VMW is set to the failure detection voltage width VWF, respectively.

In cycle T11, since both of the control signals CRL1 and CRL2 are set to the high level, when there is no abnormality in the operation of the amplification circuit 10, the output signal VO changes swiftly toward the failure detection target voltage VFM.

In cycle T12, in order to compare the output signal VO with the failure detection target voltage VFM with a high accuracy, both of the control signals CRL1 and CRL2 are set to the low level. Also, the comparison instruction signal COMPT is set to the high level, and it is determined whether the output signal VO is within the range of the failure detection voltage width VWF. Since the output signal VO is within a range of the failure detection voltage width VWF, the high level is outputted to the comparison signal COMPO.

When the output signal VO is out of the range of the failure detection voltage width VWF, the low level is outputted to the comparison signal COMPO. Receiving this, the controlling section 80 emits a failure notification signal.

In cycle T13, the differential input signals VI1 and VI2 from the sensor are inputted to the differential input signals V1 and V2, and both of the control signals CRL1 and CRL2 are set to the high level. Owing to this, the output signal VO changes swiftly toward the original level (cycle T10).

In cycle T14, both of the control signals CRL1 and CRL2 are set to the low level. Owing to this, the amplification circuit 10 shifts to the ordinary operation mode MDN.

Thus, in the failure detection mode MDF also, by setting the cut-off frequency fc to the side higher than the ordinary cut-off frequency fcn, the amplification circuit 10 can perform the failure detection swiftly.

In this embodiment, an example in which the operation is carried out by inputting the failure detection reference signals VF1 and VF2, which are generated by the reference signal generating section 60, to the amplifying section 20 has been shown. However, an unshown sensor may be set to the standard status, and sensor reference signals, which are generated at that time, may be used as the input.

Returning to the description of the operation mode MD again, when the amplification circuit 10 operates in the lowpass filter initialization mode MDL, initialization voltages VL1 and VL2 for pre-charging the capacitive element CL of the lowpass filter 30 are inputted to the differential input signals V1 and V2. The initialization voltages VL1 and VL2 are inputted to the amplifying section 20, and by the outputted amplification signal VZ, the capacitive element CL is pre-charged. At the pre-charging, both of the control signals CRL1 and CRL2 are set to the high level to increase the response speed of the lowpass filter 30 to carry out the pre-charge swiftly. The comparison judgment between the output signal VO and the initialization target voltage VLM is carried out within a lowpass filter initialization allowable error range VWL, and in accordance with the judgment result, the mode shifts to the ordinary operation mode MDN.

Figure 11:
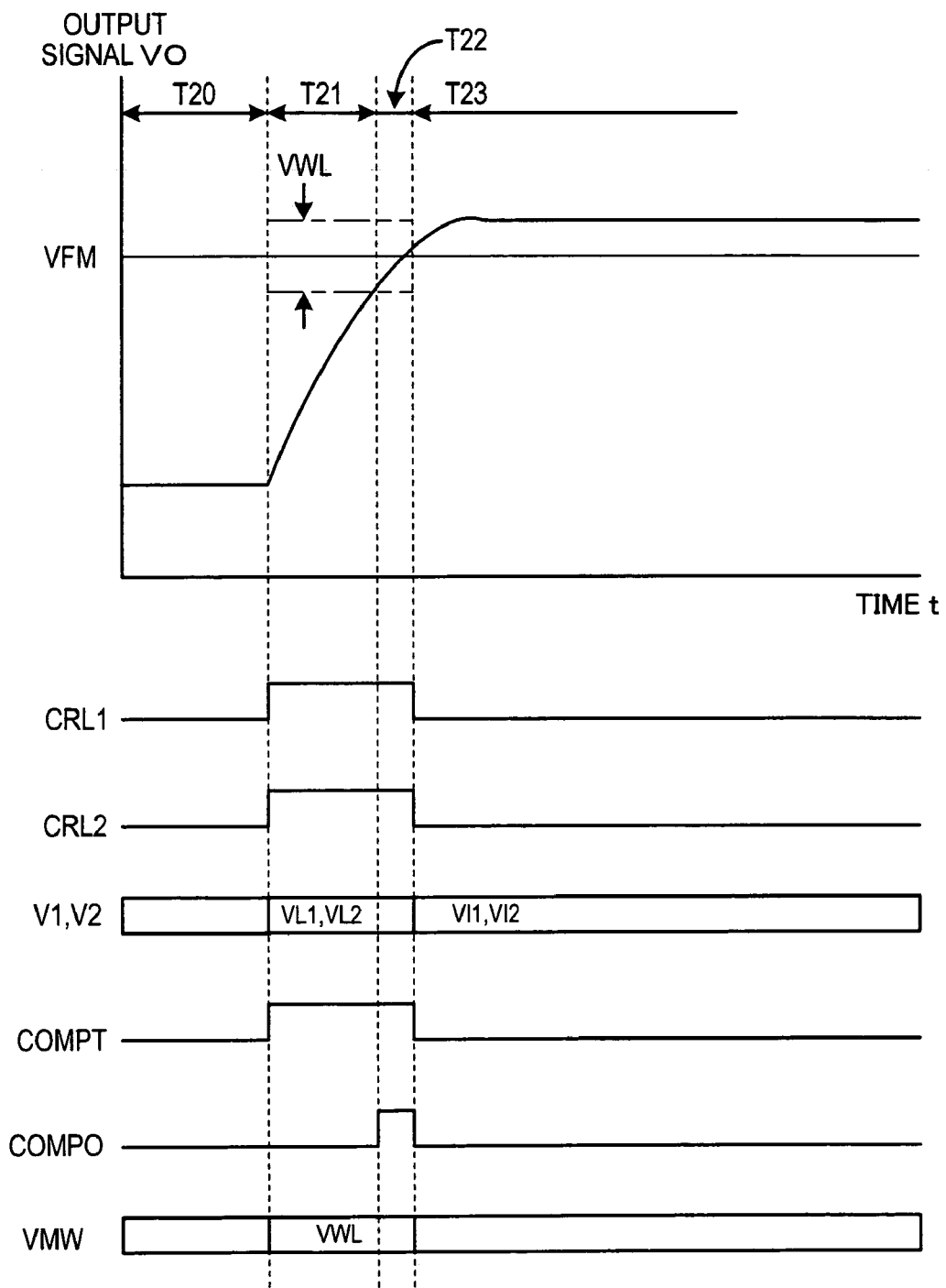
FIG. 11 is a waveform diagram showing the operation of a lowpass filter initialization mode.

Referring to FIG. 11, the operation of the lowpass filter initialization mode MDL will be described below.

FIG. 11 shows cycles T20 to T23 as the steps of the operation. Cycle T20 is the state before the power supply is turned on. Cycle T23 is a state of the ordinary operation mode MDN. In cycle T21 to T22, the amplification circuit 10 operates in the lowpass filter initialization mode MDL.

First of all, in cycle T21, when detecting the turn-on of the power supply, both of the control signals CRL1 and CRL2 are set to the high level, and the initialization voltages VL1 and VL2 are inputted to the differential input signals V1 and V2. Also, the lowpass filter initialization allowable error range VWL is set to the target voltage allowable error range VMW, and the comparison instruction signal COMPT is set to the high level.

Since both of the control signals CRL1 and CRL2 are set to the high level, the output signal VO changes swiftly toward the initialization target voltage VLM.

As a means for detecting the turn-on of the power supply, an unshown power-on reset circuit, which is well known in the art, is given. From such a means, the information is transmitted to the controlling section 80.

In cycle T22, when the output signal VO has reached within the range of the lowpass filter initialization allowable error range VWL, the comparison signal COMPO changes to the high level. When the lowpass filter initialization has completed, from the next cycle (cycle T23), the mode shifts to the ordinary operation mode MDN.

As described above, in the lowpass filter initialization mode MDL, since the amplification circuit 10 sets the cut-off frequency fc of the lowpass filter 30 to the side higher than the ordinary cut-off frequency fcn, the lowpass filter can be initialized swiftly.

In this example of the operation, by the comparison judgment between the output signal VO and the initialization target voltage VLM, the operation to shift to the ordinary operation mode MDN has been described.

As for the means to shift from the lowpass filter initialization mode MDL to the ordinary operation mode MDN, the following means may be employed. That is, using a signal outputted from the means for detecting the turn-on of the power supply as the trigger, after a predetermined waiting period, the circuit is switched to the operation mode MD. By employing such a circuit, the window comparator 51 and the target voltage generating section 52 become unnecessary. Accordingly, the circuit can be configured simply.

The present invention is not limited to the above-described embodiments. It is a matter of course that various improvements and modifications are possible without departing from the scope of the present invention.

For example, to describe special operation mode, the amplification characteristic compensation mode, the failure detection mode and the lowpass filter initialization mode have been described. However, the three modes are not always necessary, but in accordance with an embodiment, only one mode may be selected.

Also, in the example of the operation of the amplification characteristic according to the embodiments, the offset compensation has been described. In the same manner as the above-described offset compensation, the resistance value of the feedback resistance may be adjusted to carry out the gain compensation. The present invention may be applied to the case where such gain compensation is carried out, or the case where the gain compensation and the offset compensation are carried out simultaneously.

Further, in the embodiments, the amplification circuit configured such that the operational amplifier is used in the amplifying section has been described. The present invention is not limited to the above; but may be applied to the case where a bipolar transistor, an FET element and the like are used to configure and the same function is obtained.

By applying the present invention, in the amplification circuit connected with a lowpass filter, the time required for compensating the amplification characteristic and for precharging the lowpass filter at turning on the power supply can be reduced.

What is claimed is:

1. An amplification circuit, which operates in either one of operation modes of an ordinary operation mode for performing ordinary amplification operation and a special operation mode, comprising:
   an amplifying section that amplifies an input signal and generates an output signal;
   a lowpass filter connected to the amplifying section for cutting off a frequency band at the side higher than a cut-off frequency to inhibit error in the output signal due to noises; and
   a lowpass filter setting section that sets the cut-off frequency, wherein
   the cut-off frequency is, in the case of the ordinary operation mode, set to an ordinary cut-off frequency in which error in the output signal does not exceed an output allowable error as an allowable error; and in the case of the special operation mode, set to the side higher than the ordinary cut-off frequency.

2. The amplification circuit according to claim 1, further comprising a voltage value judgment section that, when the operation mode is, assuming that a voltage value obtained by inputting a predetermined reference signal or a sensor reference signal outputted from a sensor in a reference state is an actual output voltage, the special operation mode including voltage value judgment of the error in the actual output voltage with respect to a predetermined target voltage value, and assuming that the allowable error with respect to the target voltage value is a target voltage allowable error, after a period of standby time set in accordance with the cut-off frequency has passed from the point of time when the reference signal or the sensor reference signal is inputted, determines whether the output voltage is within a range of the target voltage allowable error with respect to the target voltage value, wherein the cut-off frequency is decided based on the target voltage allowable error.

3. The amplification circuit according to claim 2, further comprising a reference signal generating section that generates the reference signal and an input selecting section that switches the reference signal.

4. The amplification circuit according to claim 2, wherein the lowpass filter includes at least one of resistance element and capacitive element respectively, the lowpass filter setting section bypasses at least either one of resistance value of the resistance element and capacity value of the capacitive element included in the lowpass filter.

5. The amplification circuit according to claim 2, further comprising a failure judgment section that, when the special operation mode is a failure detection mode for judging a failure of the amplifying section based on the voltage value judgment, and assuming that the target voltage value is a voltage value uniquely decided based on the reference signal or the sensor reference signal, judges whether the target voltage value and the output voltage agree with each other within a range of the target voltage allowable error and, when they do not agree with each other, gives a notice of a failure.

6. The amplification circuit according to claim 2, further comprising a controlling section that, assuming that when the special operation mode is an amplification characteristic compensation mode for performing compensation based on a detected amplification characteristic, and assuming that the amplifying section is capable of variably compensating the amplification characteristic, and the target voltage value is a voltage value uniquely decided based on the reference signal or the sensor reference signal, changes the amplification characteristic in a predetermined variation width until the target voltage value and the output voltage value agree with each other within a range of the target voltage allowable error for compensation.

7. The amplification circuit according to claim 2, further comprising:
   an event counting section that counts the events occurring continuously in time series and outputs and holds the event count value, and
   a characteristic value storing section constituted of a nonvolatile storage that, in the measurement of the amplification characteristic, assuming that a value corresponding to the measurement result is an amplification characteristic value, and assuming that the event count value for obtaining the amplification characteristic value is the event count value during compensation, stores the amplification characteristic value and the event count value during compensation, wherein
   before measurement of the amplification characteristic, it is judged whether the difference value between the event count value during compensation stored in the characteristic value storing section and the event count value outputted from the event counting section exceed a predetermined value, when the difference value exceeds the predetermined value, the amplification characteristic value is obtained, and the obtained amplification characteristic value and the event count value during obtaining are stored in the characteristic value storing section, when the difference value does not exceed the predetermined value, the amplification circuit is compensated in accordance with the amplification characteristic value stored in the characteristic value storing section.

8. The amplification circuit according to claim 1, wherein the operation mode is a lowpass filter initialization mode among the special modes for pre-charging the lowpass filter at turning on the power supply, the lowpass filter includes at least one resistance element, and the lowpass filter setting section bypasses at least one of the resistance elements in the pre-charge operation.

9. The amplification circuit according to claim 8, further comprising:

an input selecting section that, when the power is turned on, switches the input to a predetermined initialization voltage; and a voltage value judgment section that compares and judges the output voltage and a predetermined initialization target voltage value, wherein when the output voltage at inputting the initialization voltage reaches to the initialization target voltage value, the operation mode shifts to the ordinary operation mode.

10. A control method of an amplification circuit, which operates in either one of operation modes of an ordinary operation mode for performing ordinary amplification operation and a special operation mode, comprising the steps of:

amplifying an input signal and generating an output signal;

cutting off a frequency band at the side higher than a cut-off frequency using a lowpass filter, thereby to inhibit error in the output signal due to noises; and setting the cut-off frequency, wherein the cut-off frequency is, in the case of the ordinary operation mode, set to an ordinary cut-off frequency in which error in the output signal does not exceed an output allowable error as an allowable error; and in the case of the special operation mode, set to the side higher than the ordinary cut-off frequency.

11. The control method of an amplification circuit according to claim 10, further comprising a step of, when the operation mode is, assuming that a voltage value obtained by inputting a predetermined reference signal or a sensor reference signal outputted from a sensor in a reference state is an actual output voltage, the special operation mode including voltage value judgment of the error in the actual output voltage with respect to a predetermined target voltage value, and assuming that the allowable error with respect to the target voltage value is a target voltage allowable error, after a period of standby time set in accordance with the cut-off frequency has passed from the point of time when the reference signal or the sensor reference signal is inputted, determining whether the output voltage is within a range of the target voltage allowable error with respect to the target voltage value, wherein the cut-off frequency is decided based on the target voltage allowable error.

12. The control method of an amplification circuit according to claim 11, further comprising a step of, when the special operation mode is a failure detection mode for judging a failure of the amplifying section based on the voltage value judgment, and assuming that the target voltage value is a voltage value uniquely decided based on the reference signal or the sensor reference signal, judging whether the target voltage value and the output voltage value agree with each other within a range of the target voltage allowable error and, when they do not agree with each other, giving a notice of a failure.

13. The control method of an amplification circuit according to claim 11, when the special operation mode is an amplification characteristic compensation mode for performing compensation based on a detected amplification characteristic, and assuming that, in the step of amplifying the input signal, the amplification characteristic can be variably compensated, and the target voltage value is a voltage value uniquely decided based on the reference signal or the sensor reference signal, changing the amplification characteristic in a predetermined variation width until the target voltage value and the output voltage value agree with each other within a range of the target voltage allowable error for compensation.

14. The control method of an amplification circuit according to claim 11, further comprising the steps of:

counting a predetermined event and outputting the event count value;

in the compensation of the amplification characteristic, assuming that the obtained compensation result of the amplification characteristic is an amplification characteristic value, and assuming that the event count value for obtaining the amplification characteristic compensation value is the event count value during compensation, storing the amplification characteristic compensation value and the event count value during compensation in a characteristic value storing section constituted of a nonvolatile storage; and before compensating the amplification characteristic, judging whether the difference value between the event count value and the event count value, wherein, when the difference value exceeds the predetermined value, after compensating the amplification characteristic, storing the obtained amplification characteristic compensation value and the event count value, when the difference value does not exceed the predetermined value, setting the amplification characteristic value to the amplification circuit.

15. The control method of an amplification circuit according to claim 10, wherein the operation mode is a lowpass filter initialization mode among the special modes for pre-charging the lowpass filter at turning on the power supply, the lowpass filter includes at least one resistance element, in a step of setting the cut-off frequency, bypassing at least one of resistance elements in the pre-charge operation.

16. The control method of an amplification circuit according to claim 10, further comprising the steps of:

when the power is turned on, switching the input to a predetermined initialization voltage; and comparing and judging the output voltage value and a predetermined initialization target voltage value, wherein when the output voltage at inputting the initialization voltage reaches to the initialization target voltage value, the operation mode shifts to the ordinary operation mode.

* * * * *